United States Patent
Hetzler

(10) Patent No.: US 9,972,424 B2
(45) Date of Patent: May 15, 2018

(54) ELECTRIC COMPONENT, METHOD FOR PRODUCING THE ELECTRIC COMPONENTS, AND COMPOSITE MATERIAL STRIP FOR PRODUCING THE COMPONENT

(71) Applicant: Isabellenhuette Heusler GmbH & Co. KG, Dillenburg (DE)

(72) Inventor: Ullrich Hetzler, Dillenburg-Oberscheld (DE)

(73) Assignee: Isabellenhuette Heusler GmbH & Co. KG, Dillenburg (DE)

( * ) Notice: Subject to any disclaimer, the term of this patent is extended or adjusted under 35 U.S.C. 154(b) by 0 days. days.

(21) Appl. No.: 15/519,690

(22) PCT Filed: Sep. 25, 2015

(86) PCT No.: PCT/EP2015/001912
§ 371 (c)(1),
(2) Date: Apr. 17, 2017

(87) PCT Pub. No.: WO2016/062369
PCT Pub. Date: Apr. 28, 2016

(65) Prior Publication Data
US 2017/0243679 A1    Aug. 24, 2017

(30) Foreign Application Priority Data
Oct. 24, 2014   (DE) .................. 10 2014 015 805

(51) Int. Cl.
*H01C 7/00*    (2006.01)
*H01C 1/01*    (2006.01)
(Continued)

(52) U.S. Cl.
CPC ............ *H01C 1/01* (2013.01); *G01R 15/146* (2013.01); *G01R 19/0092* (2013.01); *H01C 1/14* (2013.01); *H01C 17/00* (2013.01); *H01G 9/28* (2013.01)

(58) Field of Classification Search
CPC ............. H01C 1/01; H01C 1/14; H01C 17/00
(Continued)

(56) References Cited

U.S. PATENT DOCUMENTS 3,157,735 A    11/1964  Stroup et al.
3,895,851 A    7/1975   Bolton et al.
(Continued)

FOREIGN PATENT DOCUMENTS

DE    4243349 A1    6/1994
DE    102004009651 A1    9/2005
(Continued)

OTHER PUBLICATIONS

DE102006031839, Schloms, machine translation, Jan. 2008.*
(Continued)

*Primary Examiner* — Kyung Lee
(74) *Attorney, Agent, or Firm* — Caesar Rivise, PC

(57) ABSTRACT

The invention relates to a composite material strip for producing an electric component, in particular a resistor, in particular a low-resistance current-measuring resistor, comprising a first material strip (4) made of a copper-containing material, in particular a copper-containing conductor material, for later forming a first connection part of the electric component and comprising a second material strip (3) for later forming a second connection part of the electric component. The first material strip (4) and the second material strip (3) are electrically and mechanically connected together along a longitudinal seam, wherein the second material strip (3) consists of an aluminum-containing mate-
(Continued)

rial, in particular an aluminum-containing conductor material. The invention further relates to a corresponding production method and to a corresponding component.

35 Claims, 15 Drawing Sheets

(51) Int. Cl.
    *H01C 1/14*     (2006.01)
    *H01G 9/28*     (2006.01)
    *H01C 17/00*     (2006.01)
    *G01R 15/14*     (2006.01)
    *G01R 19/00*     (2006.01)

(58) Field of Classification Search
    USPC .......................................................... 338/333
    See application file for complete search history.

(56) References Cited

U.S. PATENT DOCUMENTS

| | | | | |
|---|---|---|---|---|
| 5,604,477 A * | 2/1997 | Rainer | ................ | H01C 17/006 |
| | | | | 29/621 |
| 7,053,749 B2 * | 5/2006 | Ishida | ................... | H01C 1/144 |
| | | | | 338/323 |
| 8,686,828 B2 * | 4/2014 | Smith | ................... | H01C 1/142 |
| | | | | 338/254 |
| 8,730,003 B2 * | 5/2014 | Smith | ................... | H01C 1/148 |
| | | | | 29/610.1 |
| 9,343,208 B2 * | 5/2016 | Tsukada | ................ | H01C 1/148 |
| 2004/0263150 A1 * | 12/2004 | Hetzler | ................ | G01R 1/203 |
| | | | | 324/126 |
| 2015/0102897 A1 | 4/2015 | Hetzler | | |

FOREIGN PATENT DOCUMENTS

| | | |
|---|---|---|
| DE | 102006031839 A1 | 1/2008 |
| DE | 102008036435 A1 | 8/2009 |
| DE | 102012006641 A1 | 10/2013 |
| DE | 102012013036 A1 | 1/2014 |
| EP | 0605800 A1 | 6/1994 |

OTHER PUBLICATIONS

EP0605800, Hetzler, machine translation, Jul. 1994.*
English language abstract for DE 102004009651 A1 (2005).
English language abstract for DE 102006031839 A1 (2008).
English language abstract for DE 102008036435 A1 (2009).
English language abstract for DE 102012006641 A1 (2013).
English language abstract for EP 0605800 A1 (1994).
International Search Report for PCT/EP2015/001912 dated Jan. 20, 2016.

* cited by examiner

ELECTRIC COMPONENT, METHOD FOR PRODUCING THE ELECTRIC COMPONENTS, AND COMPOSITE MATERIAL STRIP FOR PRODUCING THE COMPONENT

CROSS-REFERENCE TO RELATED APPLICATIONS

This application is the U.S. National Phase Application of PCT/EP2015/001912, filed Sep. 25, 2015, which claims priority from DE 102014015805.5, filed Oct. 24, 2014, the contents of which applications are incorporated herein by reference in their entireties for all purposes.

BACKGROUND OF THE INVENTION

The invention concerns a composite material strip for producing an electric component, in particular a resistor, such as for example a low-resistance current-measuring resistor ("shunt"). Furthermore, the invention concerns a corresponding production method and a corresponding electric component.

EP 0 605 800 A1 discloses a low-resistance current-measuring resistor which consists of two plate-shaped connecting parts made of a conductor material (e.g. copper) and an equally plate-shaped resistance element inserted between them and made of a resistance material (e.g. Manganin®). This known current-measuring resistor may be produced economically from a composite material strip which consists of three material strips welded along a longitudinal seam. The two outer material strips here consist of a conductor material (e.g. copper), while the middle material strip consists of the resistance material (e.g. Manganin®). The individual current-measuring resistors may be punched out of the composite material strip transversely to the strip longitudinal direction. It should be stated here that the individual material strips of the composite material strip are connected together by means of electron beam welding. This is easily possible because the resistance material (e.g. Manganin®) on the one hand and the conductor material (e.g. copper) on the other hand can be welded together easily.

In some applications, however, there is a technical need to configure the current-measuring resistor with an aluminum connecting part on one side. This is not possible with electron beam welding, since aluminum on one side and copper or Manganin® on the other cannot be welded together or are difficult to weld together. Thus in all thermal welding processes (e.g. WIG welding (WIG: Wolfram Inert Gas), laser welding, electron beam welding etc.), an intermetallic phase is formed between the aluminum and copper, wherein this intermetallic phase is extremely brittle. The brittleness of the weld seam in turn leads to a low strength, so this method is not suitable for industrial applications.

Cold welding processes (e.g. friction welding) indeed prevent the occurrence of this disruptive intermetallic connection between the aluminum component and the copper component. However, these welding processes are not suitable for producing a multilayer composite material strip. Known friction welding usually only functions on a single piece, and is therefore relatively labor-intensive and costly.

The connection to an aluminum component is useful for example in hybrid and electric vehicles which are operated with a comparatively high steady current, so that the conductor rails must have a significantly larger cross-section than in conventional vehicles with an internal combustion engine. The same however also applies to all other modern motor vehicles, since more and more functions are being implemented via electric actuators (valves, motors), whereby the mean steady current in larger vehicles is already approaching 200 A. For reasons of weight and cost therefore, conductor rails are being increasingly made of aluminum. Both on the ground side and on the live side (battery or alternator) however, a transition must be made between the aluminum conductor rail and the components which are usually made of copper.

DE 10 2012 006 641 A1 discloses a cable-connecting element in which an insert of aluminum is plated onto a flat part made of copper. The copper part and the aluminum part are here arranged planar parallel to each other, which excludes production from a composite material strip.

The same applies to U.S. Pat. No. 3,895,851. This publication discloses a cable-connecting element in which an aluminum coating is applied to a copper part. This structure also excludes production from a composite material strip.

In U.S. Pat. No. 3,157,735 and DE 10 2004 009 651 A1 too, the aluminum part and the copper part are arranged planar parallel to each other, which excludes production from a composite material strip.

Furthermore, reference is made to DE 42 43 349 A1 and DE 10 2012 013 036 A1 as the prior art.

The invention is therefore based on the object of achieving such a transition from an aluminum component to a copper component.

This object is achieved by a composite material strip, a production method and a corresponding component of the invention.

SUMMARY OF THE INVENTION

The invention is based on the technico-physical knowledge that such a connection between an aluminum component on one side and a copper-containing component on the other can be achieved by a special joining method, such as for example by roll-plating (e.g. laser induction roll-plating or laser roll-plating), or also by ultrasound welding. Such a connection between firstly an aluminum component and secondly a copper-containing component may also be described as a transition joint. The invention is not however restricted to these examples with regard to the joining method used, but may also be implemented with other joining methods which allow an aluminum-containing component to be connected to a copper-containing component.

Laser induction roll-plating is known from the prior art and therefore need not be described in detail. Merely as an example, reference is made to DE 10 2008 036 435 A1.

Ultrasound welding is also known from the prior art and therefore need not be described in more detail.

The invention firstly comprises a composite material strip for producing an electric component, such as for example a resistor, in particular a low-resistance current-measuring resistor as known for example from EP 0 605 800 A1. The composite material strip according to the invention, in accordance with the composite material strip known from EP 0 605 800 A1, firstly consists of several metal strips which are connected together in pairs along a longitudinal seam. Here the first material strip in the composite material strip consists of a copper-containing material, in particular a copper-containing conductor material, and serves for later formation of a first connecting part of the electric component. The second material strip of the composite material strip however serves for later formation of the second connecting part of the electric component, wherein the first material strip and the second material strip are connected together electrically and mechanically along a longitudinal seam. The composite material strip according to the invention now differs from the composite material strip known from EP 0 605 800 A1 in that the second material strip consists of an aluminum-containing material, in particular an aluminum-containing conductor material. The composite material strip according to the invention therefore consists of at least two material strips, of which the first material strip consists of a copper-containing material while the second material strip consists of an aluminum-containing material. This joining of an aluminum-containing material to a copper-containing material is possible in the context of the invention thanks to the use of a suitable joining method. Suitable methods here are for example the known roll-plating (e.g. laser induction roll-plating or laser roll-plating) and ultrasound welding, also known.

The concept of a longitudinal seam between the adjacent material strips, as used in the context of the invention, preferably means that the adjacent material strips lie in a common plane. The adjacent material strips are thus connected together by the longitudinal seam, preferably along their longitudinal edges. This is distinguished from a planar parallel arrangement of the material strips, as present for example in plating.

The term "connecting part" as used in the context of the invention means that the connecting part is connected mechanically and electrically to the resistance element. Preferably, the connecting part also serves as an electrical connection contact, for example to introduce or discharge the electrical current, or to measure voltage following the four-conductor technique. The concept of a connecting part is however to be interpreted generally in the context of the invention, so that it also includes connecting parts which do not serve directly for voltage measurement or for introduction or discharge of electrical current, but which are merely connected to the actual connecting contacts.

In a preferred exemplary embodiment of the invention, the composite material also comprises a third material strip which consists of a resistance material (e.g. copper-manganese-nickel alloy), wherein the third material strip serves for later formation of a resistance element of the finished component. The third material strip is then connected electrically and mechanically along a longitudinal seam to the first material strip consisting of the copper-containing conductor material.

In one exemplary embodiment of the invention, the composite material strip according to the invention also comprises a fourth material strip which consists of the copper-containing conductor material and serves for later formation of a third connecting part of the component. This fourth material strip is then connected electrically and mechanically along its longitudinal edge to third material strip made of the resistance material.

The first material strip consisting of the copper-containing material may here consist of a single material strip. Alternatively, however, it is also possible that the first material strip consisting of the copper-containing material in turn consists of two material strips which are joined along a longitudinal seam, preferably by electron beam welding.

The second material strip consisting of the aluminum-containing material may also consist of a single material strip. However, alternatively, it is also possible that the second material strip consisting of the aluminum-containing material is also assembled from two material strips, preferably by electron beam welding.

On assembly of the first or second material strip from two or more material strips respectively, it is possible that the material strips to be joined have the same thickness. However, alternatively, it is also possible that the material strips to be joined have different thicknesses.

It has already been mentioned above briefly that the first material strip made of the copper-containing material may be joined to the second material strip made of the aluminum-containing material via a suitable joining process which allows aluminum and copper to be joined. For example, the known process of roll-plating, in particular laser induction roll-plating or laser roll-plating, are suitable. Another suitable joining process for joining aluminum and copper is ultrasound welding, which is also known.

The assembly of the material strips from the copper-containing material (e.g. copper, copper-manganese-nickel alloy), and the joining of two aluminum-containing strips, may however take place using a conventional welding process, wherein the known electron beam welding has proved particularly advantageous.

In the preferred exemplary embodiment of the invention therefore, only the longitudinal seams between aluminum-containing components on one side and copper-containing components on the other are produced via a special welding process (e.g. laser induction roll-plating), while all other longitudinal seams are preferably produced by electron beam welding.

The copper-containing material is preferably a conductor material, such as for example copper or a copper alloy.

The aluminum-containing material is preferably also a conductor material, such as for example aluminum or an aluminum alloy.

The resistance material already mentioned above however preferably has a greater specific electrical resistance than the conductor material. The specific electrical resistance of the resistance material may for example lie in the range from $1 \cdot 10^{-8}$ $\Omega$m to $50 \cdot 10^{-7}$ $\Omega$m, wherein various values are possible inside this value range.

One example for the resistance material is a copper-manganese alloy, in particular a copper-manganese-nickel alloy (e.g. Manganin®). Another example of a resistance material however is a nickel-chromium alloy.

It should furthermore be mentioned that the material strip consisting of the resistance material may be thinner than the other material strips, which preferably have the same thickness.

As well as the composite material strip according to the invention described above, the invention also comprises a corresponding production method for producing an electric component, such as for example an electrical resistor (e.g. low-resistance current-measuring resistor).

In the production process according to the invention, firstly two narrow material strips are connected together electrically and mechanically along their longitudinal seam, wherein the first material strip is made of a copper-containing material (preferably a conductor material), while the second material strip is made of an aluminum-containing material (preferably a conductor material). The connection is created preferably using said roll-plating, in particular laser induction roll-plating or laser roll-plating. Then further aluminum or copper-containing strips (including resistance materials) may be welded to the respective free copper or aluminum sides using the known and tested electron beam welding process.

In the production method according to the invention, a third material strip consists of a resistance material, such as for example a copper-manganese-nickel alloy. This third material strip serves for later formation of a resistance element of the component. In the production method according to the invention, this third material strip is connected electrically and mechanically to the first material strip made of the copper-containing conductor material, for example by electron beam welding.

In addition, a fourth material strip may also be added which consists of the copper-containing material, in order later to form a connecting part of the component to be produced. This fourth material strip is then joined to the third material strip made of resistance material. Also, an aluminum-containing strip, preferably a conductor material, as a fifth strip is welded to the aluminum side of the first composite material also by means of electron beam welding, in order later to form a second connecting part of the component to be produced. As a result, the composite material strip may then have a sequence of material strips in the order aluminum-copper-Manganin®-copper.

In a variant of the invention, the composite material strip is assembled from a tri-strip with three joined material strips and a bi-strip with two joined material strips. The tri-strip here comprises two outer material strips made of the copper-containing conductor material, and a middle material strip made of the resistance material. The bi-strip however comprises a material strip made of the copper-containing conductor material and a material strip made of the aluminum-containing conductor material. When the tri-strip is joined to the bi-strip, the copper-containing material strip of the tri-strip is then joined to the copper-containing material strip of the bi-strip. This allows a conventional joining method, such as for example electron beam welding, to be used for joining the tri-strip to the bi-strip.

Finally, an aluminum-containing strip (preferably made of a conductor material) as a fifth strip is welded to the aluminum side of the composite material strip, also by means of electron beam welding, in order later to form a second connecting part of the component to be produced.

Alternatively, however, it is also possible that the composite material strip according to the invention is assembled from two bi-strips. The first bi-strip then comprises a material strip made of the copper-containing conductor material and a material strip made of the aluminum-containing conductor material. The second bi-strip however comprises a material strip made of the resistance material and a material strip made of the copper-containing conductor material. The two bi-strips are then joined together so that in each case, the copper-containing material strips are joined. This also allows the use of a conventional joining process such as for example electron beam welding.

Finally, an aluminum-containing strip (preferably made of a conductor material) as a fifth strip is welded to the aluminum side of the composite material strip, again by means of electron beam welding, in order later to form a second connecting part of the component to be produced.

As part of the production method according to the invention, then preferably the individual electric components are separated from the composite material strip transversely to the composite material strip. For this, the individual electric components are cut transversely to the strip longitudinal direction, for example by punching.

Then the separated components may also be bent, for example transversely to the strip longitudinal direction.

A further method step may consist of adjusting the electrical resistance value of the resistor cut from the composite material strip. For this, for example by means of a laser, notches may be cut in the resistance element in order to adjust the desired electrical resistance value.

Finally, the invention comprises a corresponding electric component, in particular an electrical resistor, such as for example a low-resistance current-measuring resistor. The electric component comprises two connecting parts which are joined together electrically and mechanically. The first connecting part here consists of a copper-containing material, in particular a conductor material made of copper. The second connecting part however consists of an aluminum-containing material, in particular a conductor material. The two connecting parts may for example be connected together by laser induction roll-plating.

In addition, the component according to the invention preferably also comprises a resistance element made of a resistance material (e.g. Manganin®), wherein the resistance element is connected electrically and mechanically to the first connecting part made of the copper-containing conductor material, for example by conventional electron beam welding. Here the component (resistor) also comprises a third connecting part made of the copper-containing conductor material, wherein the third connecting part made of the copper-containing conductor material is connected to the resistance element, for example by electron beam welding. The resistance element here thus lies in the current flow path between the first connecting part, made of the copper-containing conductor material, and the third connecting part, made of the copper-containing conductor material.

It should furthermore be mentioned that the connecting parts and/or the resistance element are preferably plate-shaped. This means that the connecting parts or the resistance element are relatively thin and have parallel top and bottom sides.

The connecting parts and the resistance element may here be either flat or bent, which is known in itself from the prior art.

The copper-containing conductor material is preferably copper or a copper alloy.

The aluminum-containing material however is preferably pure aluminum or an aluminum alloy.

Examples for the resistance material are a copper-manganese alloy, in particular a copper-manganese-nickel alloy (e.g. Manganin®) and a nickel-chromium alloy.

It should furthermore be mentioned that the resistance material of the resistance element preferably has a greater specific electrical resistance than the conductor material.

However, the resistance material of the resistance element is preferably low-resistance. This means preferably that the resistance material has a specific electrical resistance which for example may lie in the range from $1 \cdot 10^{-8}$ Ωm to $50 \cdot 10^{-7}$ Ωm.

The resistance value of the complete resistor however preferably lies in the range from 0.1 μΩ to 1 mΩ.

It should furthermore be mentioned that the resistor according to the invention may have a steady current strength of at least 100 A, 1 kA, 2 kA, 5 kA or even 10 kA.

The thickness of the resistor according to the invention however preferably lies in the range from 0.2 mm to 20 mm, wherein specific values are possible inside this value range.

It should furthermore be mentioned that the resistor according to the invention is preferably relatively temperature-constant. The resistance value of the resistor according to the invention therefore preferably has a temperature coefficient of less than 500 ppm/K, 200 ppm/K or 50 ppm/K.

In addition, the inductance of the resistor according to the invention is preferably less than 10 nH, 3 nH or even 1 nH.

The length in the current flow direction of the resistor according to the invention is preferably 10 mm to 150 mm, whereas the width lies preferably in the range from 5 mm to 20 mm.

Furthermore, the invention also comprises a conductor rail arrangement with a first conductor rail made of an aluminum-containing conductor material and a component according to the invention. The second connecting part of the component, consisting of the aluminum-containing conductor material, is here connected electrically and mechanically to the first conductor rail, which also consists of an aluminum-containing conductor material. For example, this connection may be produced by a screw connection, a rivet connection or by welding. In this way, a connection may be created between the so-called copper world and the so-called aluminum world.

In addition, a second conductor rail may be provided, made of a copper-containing conductor material. The component according to the invention then contacts firstly the aluminum conductor rail and secondly the copper conductor rail.

Finally, the conductor rail arrangement according to the invention may also comprise a capacitor, such as for example an aluminum electrolyte capacitor (Elko) with contact zones made of an aluminum-containing conductor material.

BRIEF DESCRIPTION OF THE DRAWINGS

Further advantageous refinements of the invention are explained in more detail below, together with the description of the preferred exemplary embodiments of the invention, with reference to the figures. The drawings show.

DETAILED DESCRIPTION OF PREFERRED EMBODIMENTS

Figure 1A:
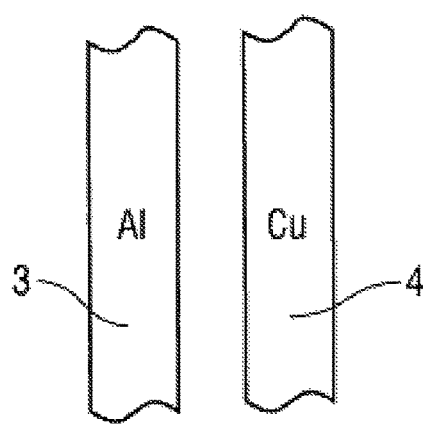
FIGS. 1A-1F various successive production stages in the production of a composite material strip according to the invention, FIGS. 2A-2F the method steps from FIGS. 1A-1F in a cross-section view, FIG. 3 the production method according to FIGS. 1A-1F and 2A-2F in the form of a flow diagram, FIGS. 4A-4F various production steps in the production of an alternative exemplary embodiment of a composite material strip according to the invention, FIGS. 5A-5F the method steps from FIGS. 4A-4F in a cross-section view, FIG. 6 the production method according to FIGS. 4A-4F and 5A-5F in the form of a flow diagram, FIG. 7 a diagrammatic cross-section view through a component according to the invention for electrical contacting, FIG. 8 a modification of FIG. 7, FIG. 9 a diagrammatic depiction to illustrate the production of a current-measuring resistor made from a composite material strip with three strips, FIG. 10 a diagrammatic depiction for production of a current-measuring resistor made from a composite material strip with four material strips, FIG. 11 a diagrammatic depiction of the connection of an aluminum conductor rail to a battery terminal with a current-measuring resistor, FIG. 12 a diagrammatic depiction of the connection of an aluminum conductor rail to a copper conductor rail, FIG. 13 a modification of FIG. 12, FIG. 14 a diagrammatic depiction of the connection of an aluminum conductor rail to a copper conductor rail, FIG. 15 a modification of FIG. 14, FIG. 16 a modification of FIGS. 14 and 15, FIG. 17 a diagrammatic depiction of the connection of a copper conductor rail to an aluminum electrolyte capacitor, and FIG. 18 a modification of FIG. 5F.
Figure 1B:
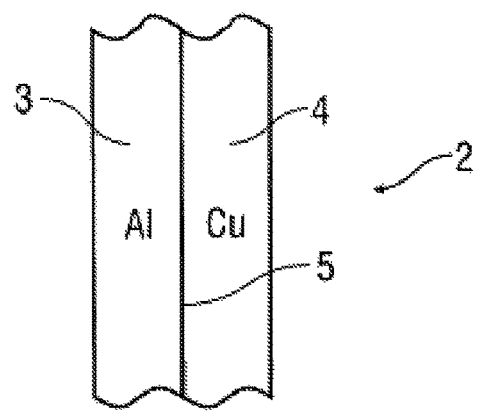
Figure 1C:
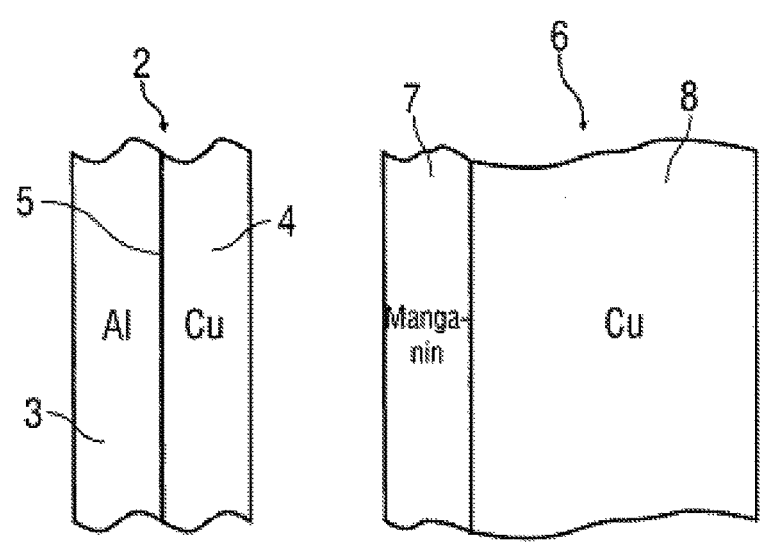
Figure 1D:
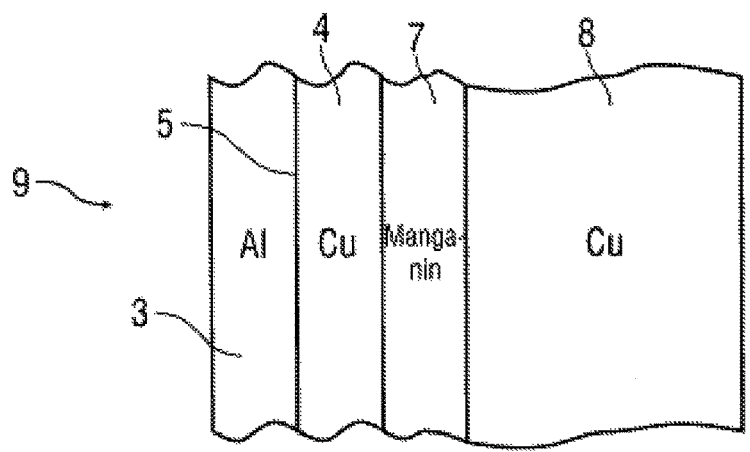
Figure 1E:
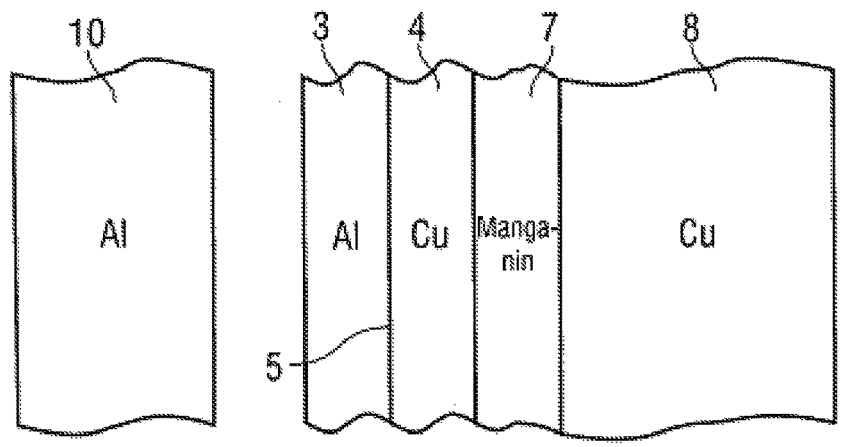
Figure 1F:
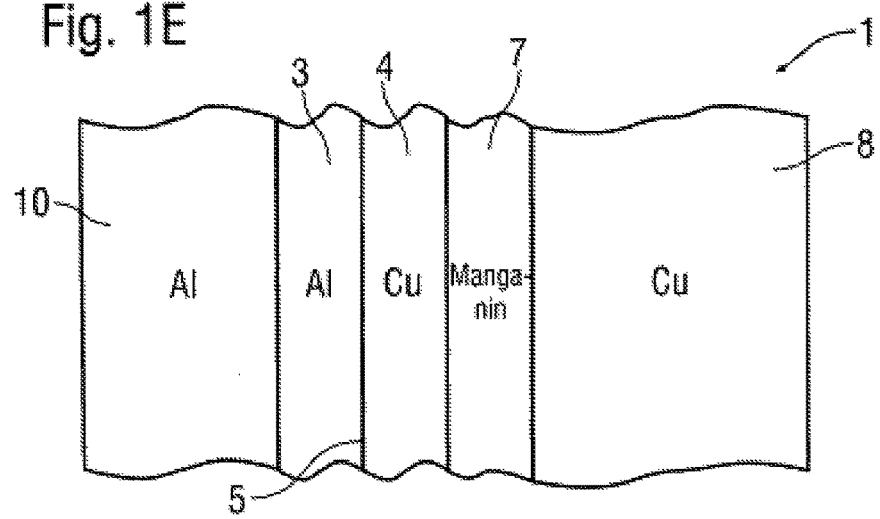

In the description below, initially a first exemplary embodiment is described as depicted in FIGS. 1A-1F, 2A-2F and 3. FIGS. 1A-1F each show various method stages of the production method according to the invention for producing a finished composite material strip 1 as depicted in FIG. 1F. FIGS. 2A-2F show a top view of the individual method stages according to FIGS. 1A-1F. FIG. 3 however shows the production method in the form of a flow diagram.

In a first method step S1, firstly a bi-strip 2 is assembled from an aluminum strip 3 and a copper strip 4, for example by laser induction roll-plating along a longitudinal seam 5.

In a second step S2, a further bi-strip 6 is assembled from a Manganin® strip 7 and a copper strip 8, for example by electron beam welding.

In a third step S3, the two bi-strips 2, 6 are joined together by electron beam welding. Here the copper strip 4 is welded to the Manganin® strip 7, which can easily take place by electron beam welding.

In a further step S4, the resulting composite material strip 9 is joined to a further aluminum strip 10 by electron beam welding.

Figure 2A:
Figure 2B:
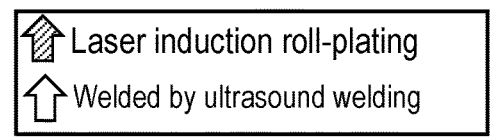
Figure 2B:
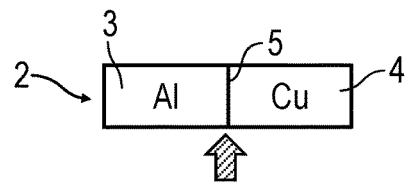
Figure 2C:
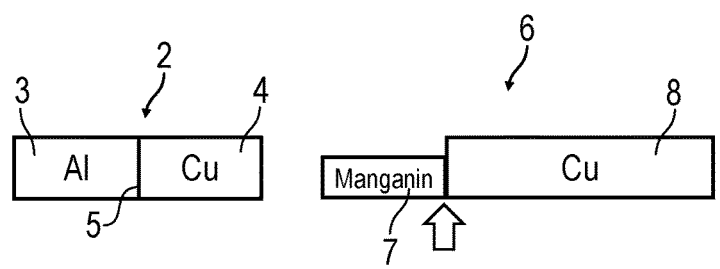
Figure 2D:
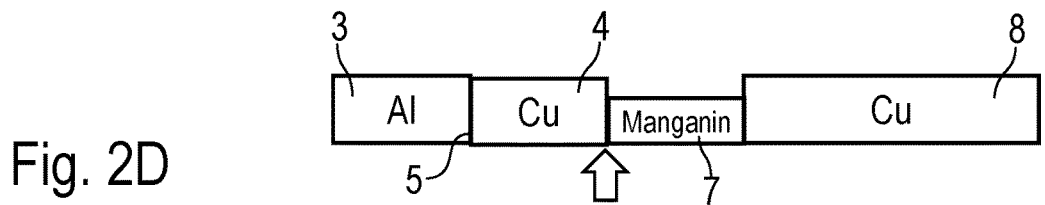
Figure 2E:
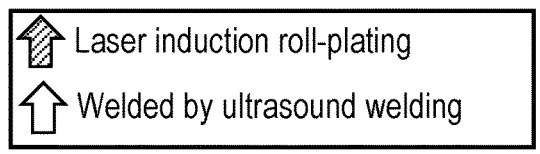
Figure 2E:
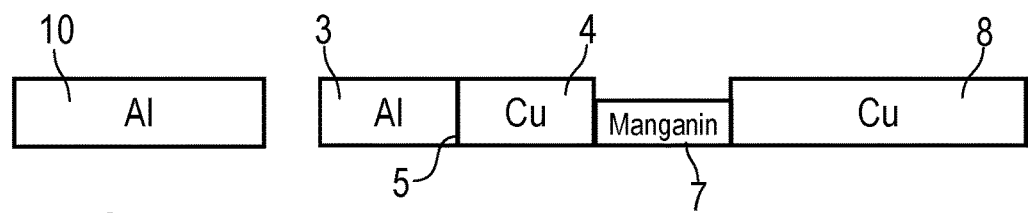
Figure 2F:
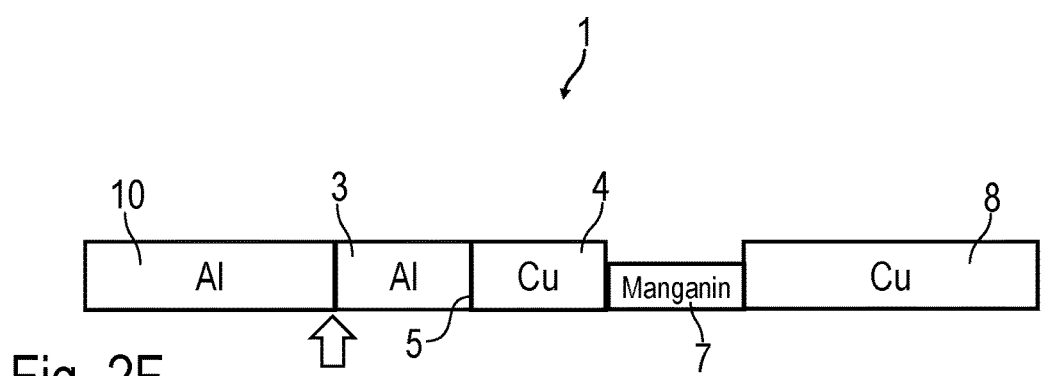
Figure 3:
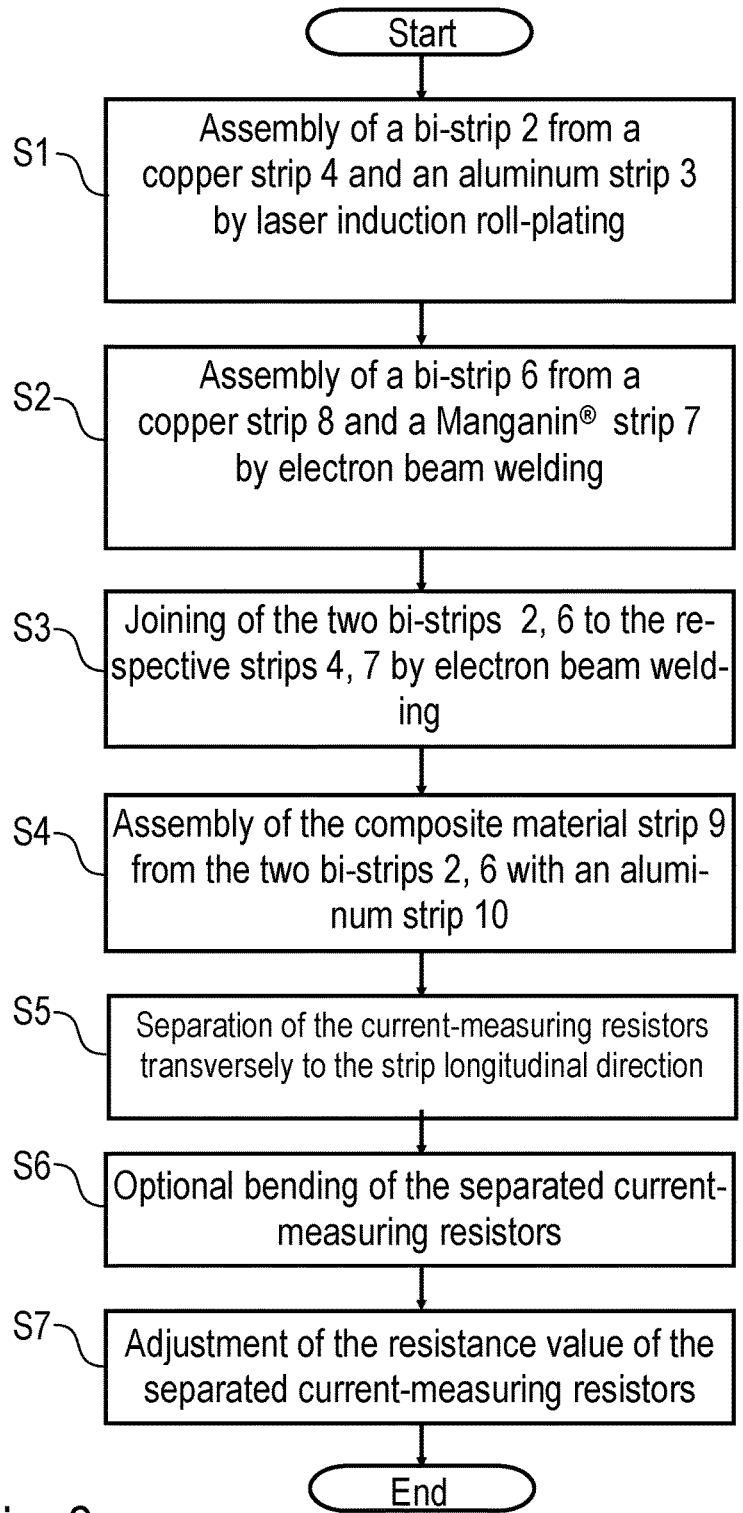
Figure 4A:
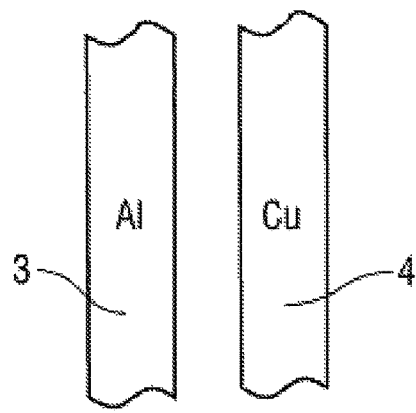
Figure 4B:
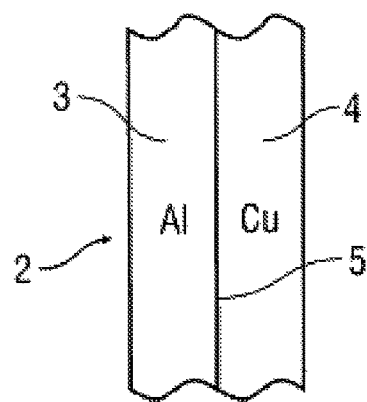
Figure 4C:
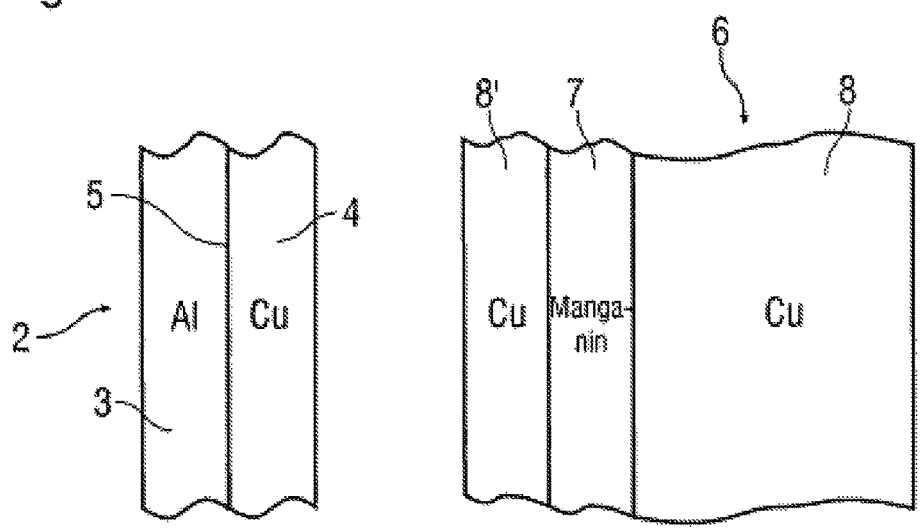
Figure 4D:
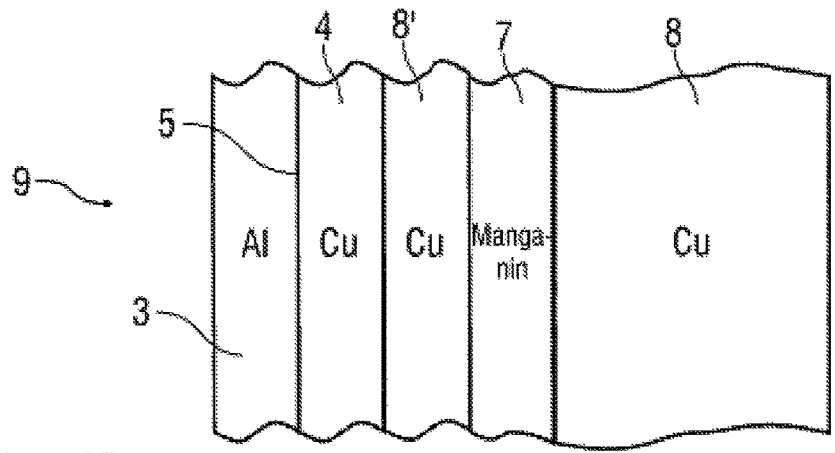
Figure 4E:
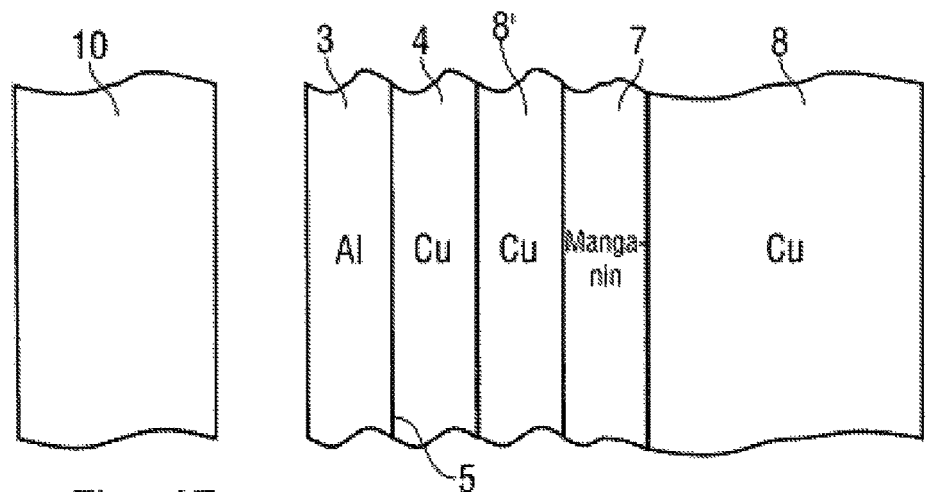
Figure 4F:
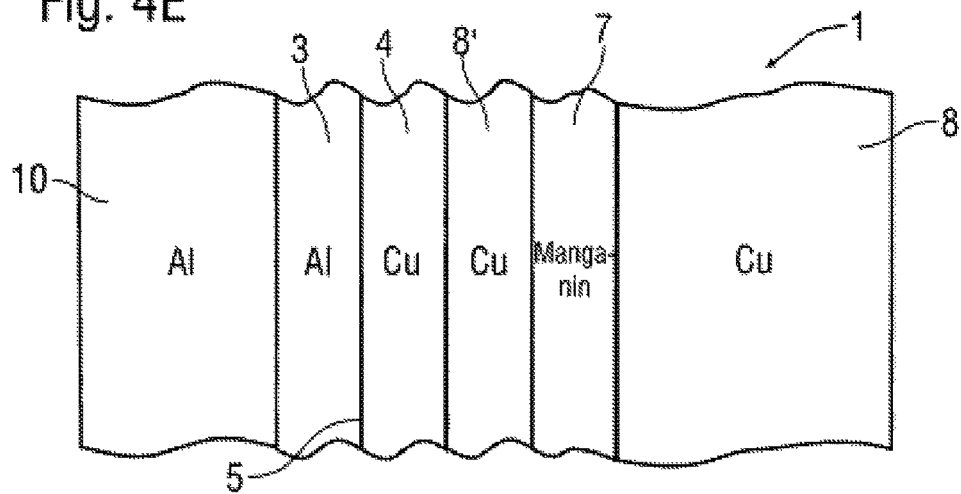
Figure 5A:
Figure 5B:
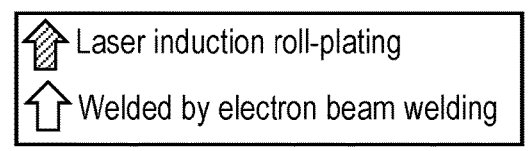
Figure 5B:
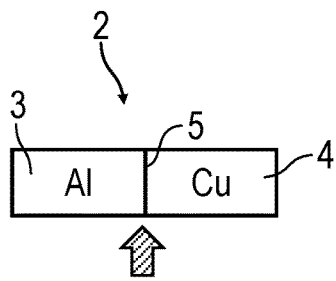
Figure 5C:
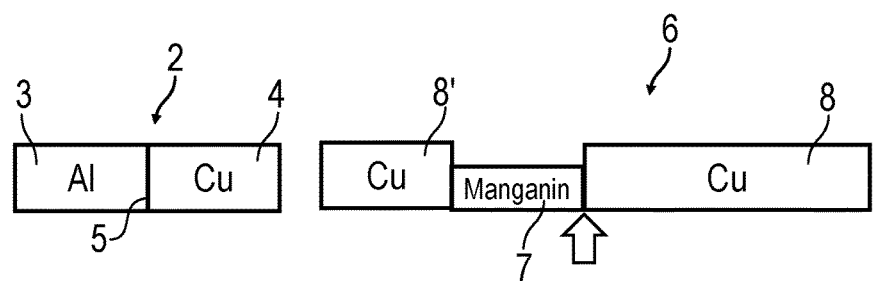
Figure 5D:
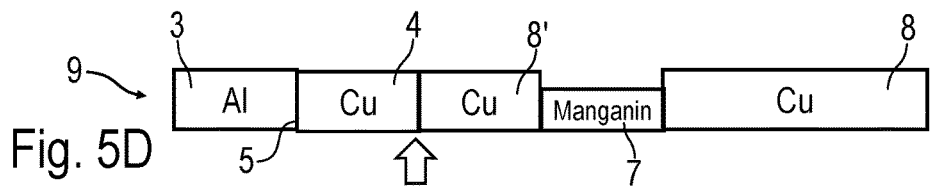
Figure 5E:
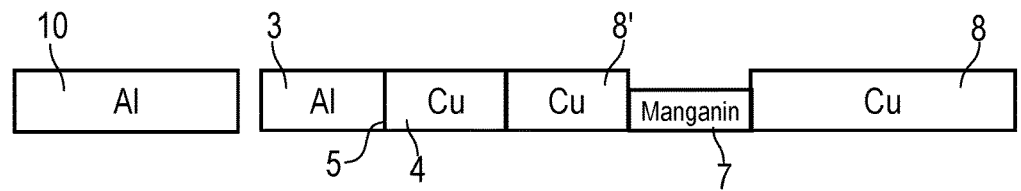
Figure 5F:
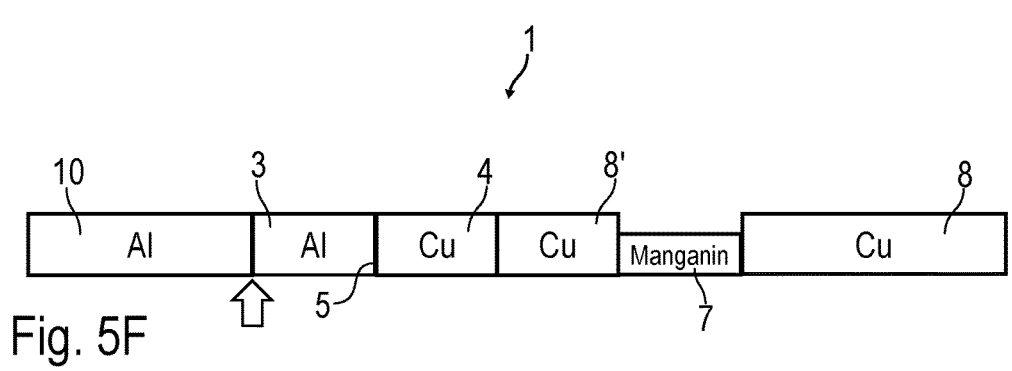
Figure 6:
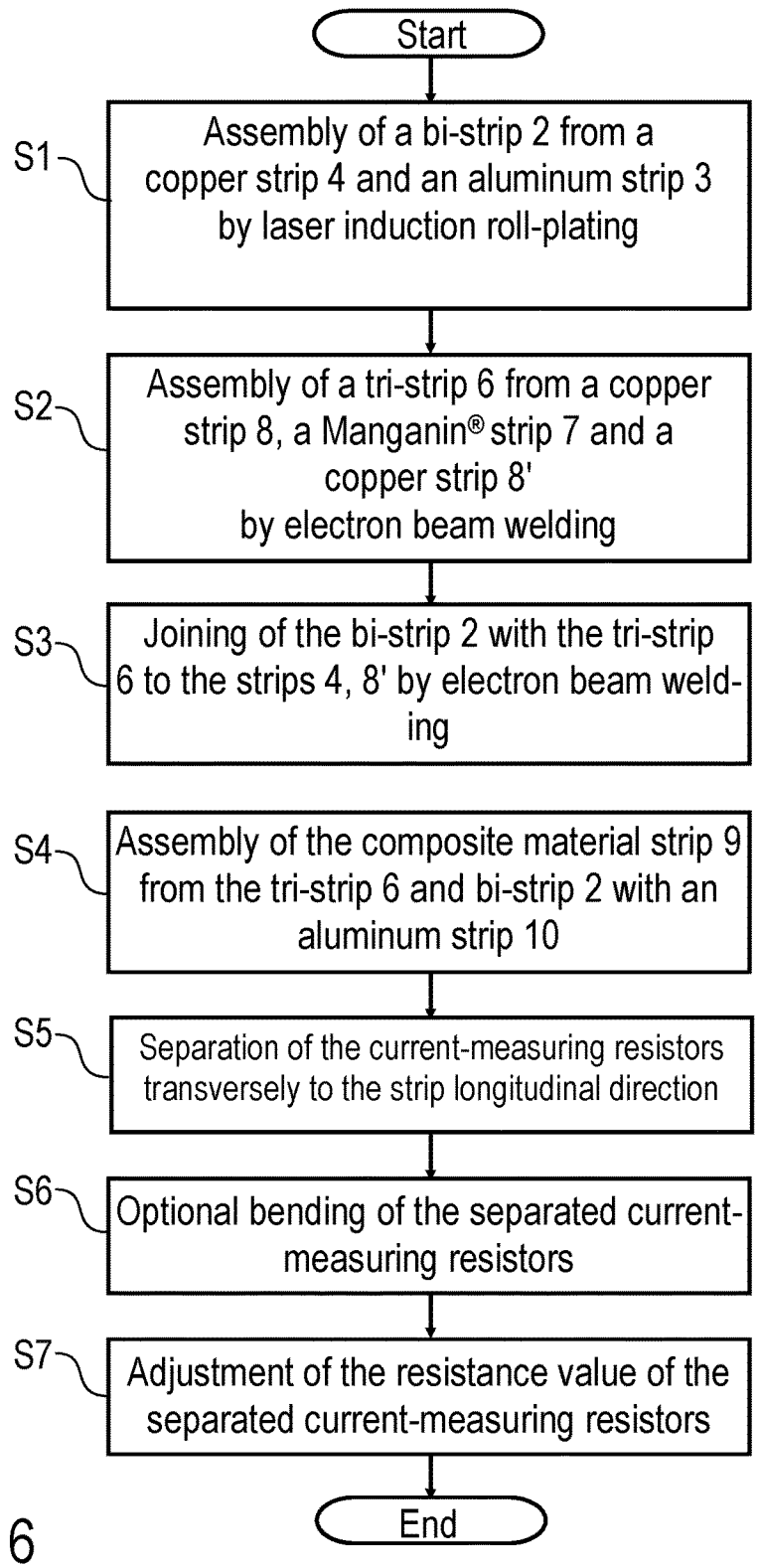

In a next step S5, the composite material strip shown in FIGS. 1F and 2F is then divided into individual current-measuring resistors transversely to the strip longitudinal direction, for example by punching transversely to the strip longitudinal direction.

In an optional step S6, the separated current-measuring resistors may then be bent.

Finally, in a step S7, the resistance value of the separated current-measuring resistors is adjusted, which may take place in the conventional fashion.

FIGS. 4A-4F, 5A-5F and 6 show a modification of the exemplary embodiment described above according to FIGS. 1A-1F, 2A-2F and 3, so to avoid repetition, reference is made to the above description wherein the same reference numerals are used for corresponding details.

One feature of this exemplary embodiment is that instead of a bi-strip 6, a tri-strip 6' is provided. The tri-strip 6', in addition to the copper strip 8 and the Manganin® strip 7, comprises a further copper strip 8'.

Figure 7:
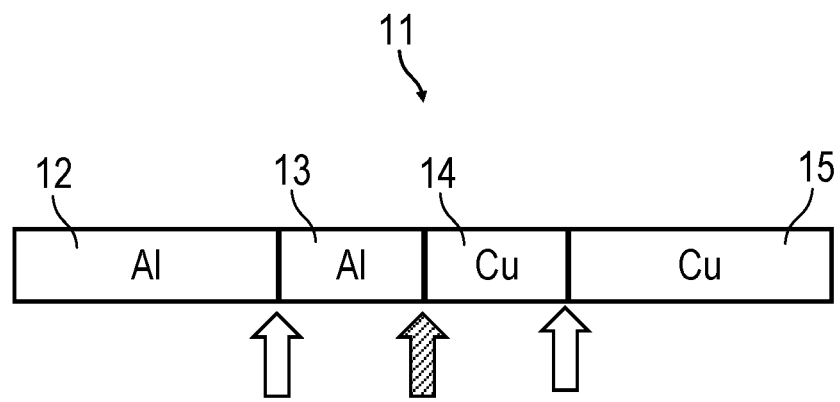

FIG. 7 shows a simplified cross section depiction of an electric component 11 according to the invention for electrical contacting, for example of conductor rails.

The component 11 consists of two plate-shaped aluminum parts 12, 13, and two also plate-shaped copper components 14, 15.

The two aluminum components 12, 13 and the two copper components 14, 15 are respectively connected together electrically and mechanically by electron beam welding.

The connection between the aluminum component 13 and the copper component 14 however takes place by laser induction roll-plating.

Figure 8:
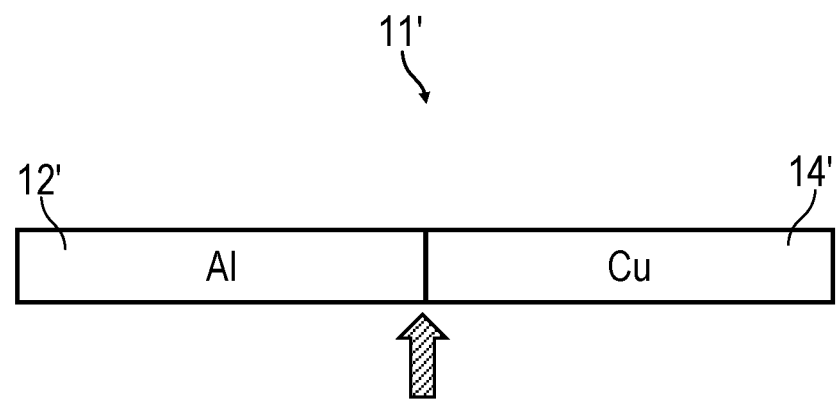

FIG. 8 shows a modification of FIG. 7. Here a component 11' is provided which is assembled from a single aluminum component 12' and a single copper component 14' by laser induction roll-plating.

Figure 9:
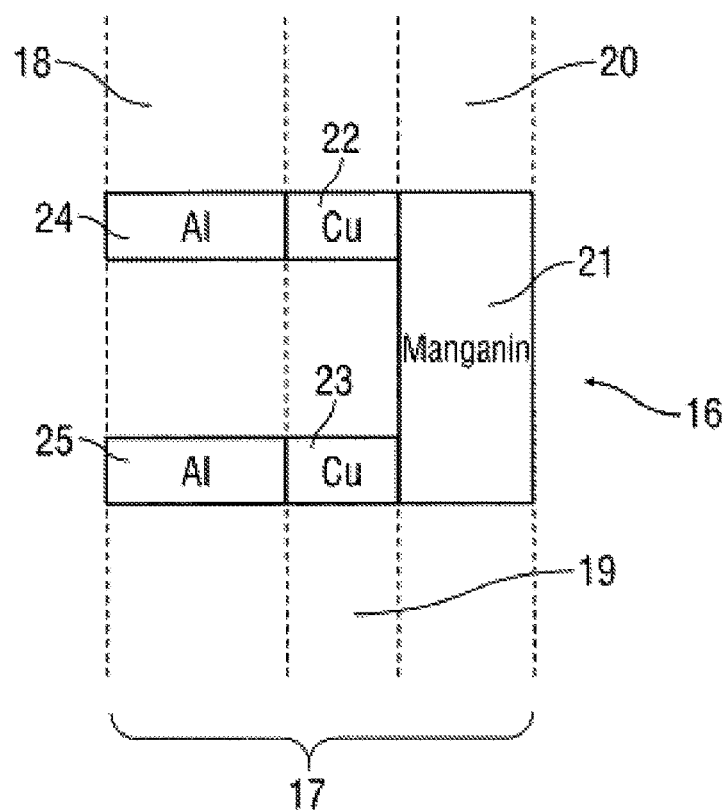

FIG. 9 shows a diagrammatic depiction for production of a current-measuring resistor 16 from a composite material strip 17 which consists of an aluminum strip 18, a copper strip 19 and a Manganin® strip 20.

The current-measuring resistor 16 here consists of a resistance element 21 made of Manganin®, two connecting parts 22, 23 made of copper, and two connecting parts 24, 25 made of aluminum.

The connecting parts 22, 24, 23, 25 are here thus arranged on the same side of the resistance element 21, which is known in itself from the patent application EP 0 605 800 A1 cited initially.

Figure 10:
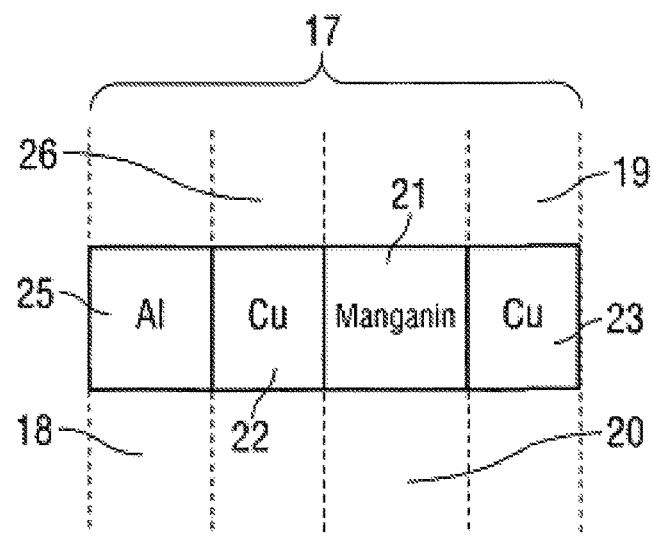

FIG. 10 shows a modification of the exemplary embodiment according to FIG. 9, so to avoid repetition, initially reference is made to the above description of FIG. 9, wherein the same reference numerals are used for corresponding details.

One feature of this exemplary embodiment is firstly that the composite material strip 17 also comprises a further copper strip 26. The two connecting parts 23, 22 are here arranged therefore on opposite sides of the resistance element 21, which is also known in itself from EP 0 605 800 A1.

Figure 11:
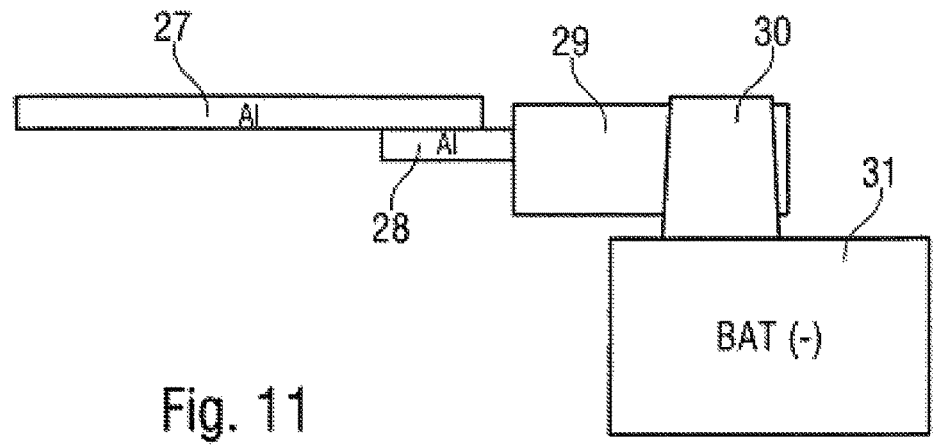

FIG. 11 shows a diagrammatic depiction to illustrate the electrical connection of an aluminum conductor rail 27 via an aluminum connector 28 to a battery terminal 29 of a negative pole 30 of the battery 31.

Here again, a connection may be produced between the aluminum world of the aluminum conductor rail 27 on one side, and the copper world of the battery terminal 29 on the other.

Figure 12:
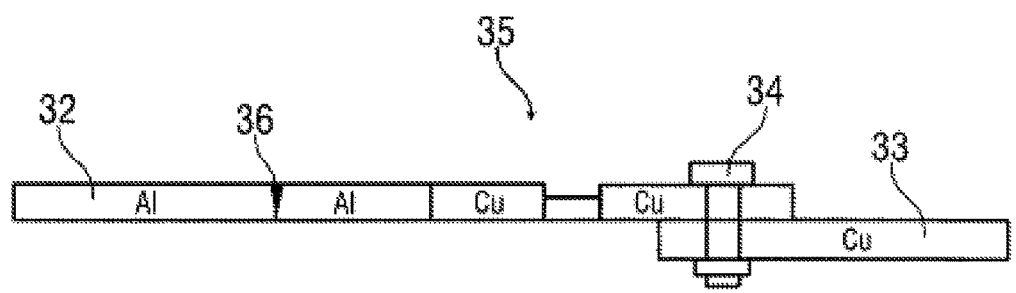

FIG. 12 shows a diagrammatic depiction for connection of an aluminum conductor rail 32 to a copper conductor rail 33 via a screw connection 34, a current-measuring resistor 35 and a weld connection 36.

Figure 13:
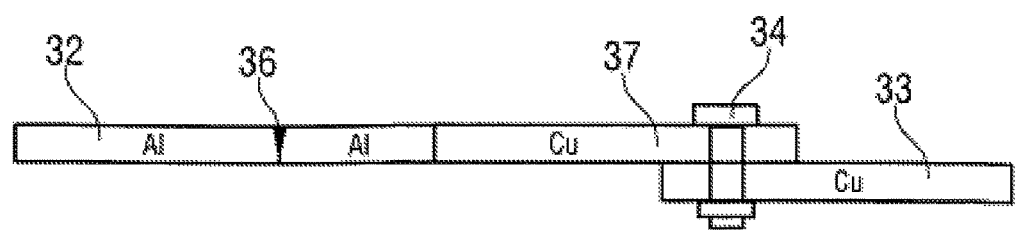

FIG. 13 shows a modification of FIG. 12, wherein the current-measuring resistor 35 is replaced by a single copper conductor rail 37.

Figure 14:
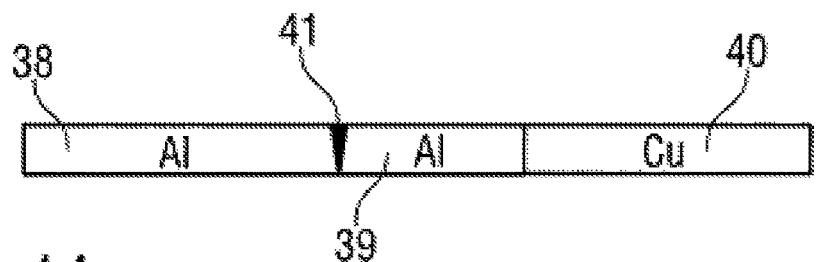
Figure 15:
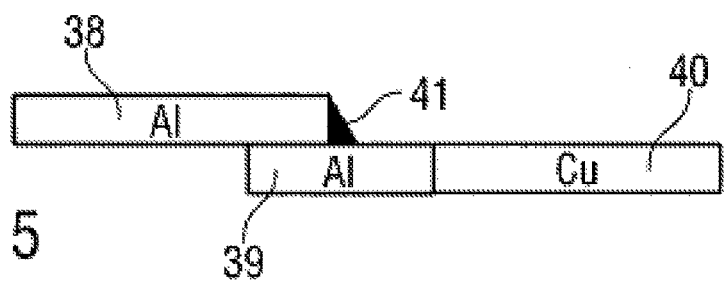
Figure 16:
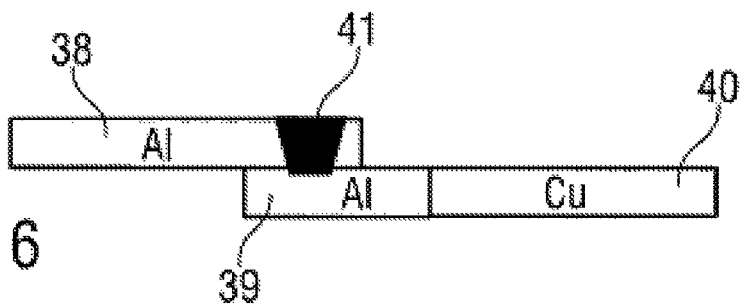

FIGS. 14-16 show different variants for connecting an aluminum conductor rail 38, 39 to a copper conductor rail 40.

The two aluminum conductor rails 38, 39 are here connected together respectively via different variants of a weld connection 41.

Figure 17:
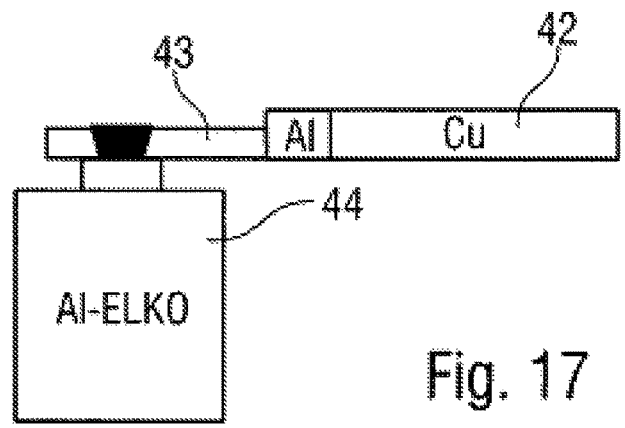

FIG. 17 shows a diagrammatic depiction for connection of a copper conductor rail 42 by means of an aluminum copper component 43 to an aluminum electrolyte capacitor 44.

Figure 18:
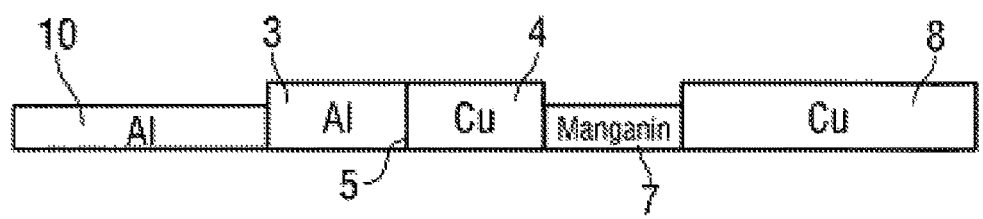

FIG. 18 finally shows a modification of FIG. 2F, so to avoid repetition, reference is made to the above description.

One feature of this modification is that the aluminum strip 3 is thinner than the other strips.

The invention is not restricted to the preferred exemplary embodiments described above. Rather, many variants and modifications are possible which also make use of the inventive concept and therefore fall within the scope of protection. In particular, the invention also claims protection for the subject and features of the subclaims, independently of the claims to which they refer.

LIST OF REFERENCE NUMBERS

1 Composite material strip
2 Bi-strip
3 Aluminum strip
4 Copper strip
5 Longitudinal seam
6 Bi-strip
6' Tri-strip
7 Manganin® strip
8 Copper strip
8' Copper strip
9 Composite material strip
10 Aluminum strip
11 Component
11' Component part
12 Aluminum part
12' Aluminum component part
13 Aluminum part
14 Copper component
14' Copper component
15 Copper component
16 Current-measuring resistor
17 Composite material strip
18 Aluminum strip
10 Copper strip
20 Manganin® strip
21 Resistance element
22 Connecting part made of copper
23 Connecting part made of copper
24 Connecting part made of copper
25 Connecting part made of copper
26 Copper strip
27 Aluminum conductor rail
28 Aluminum connector
29 Battery terminal
30 Negative pole of the battery
31 Battery
32 Aluminum conductor rail
33 Copper conductor rail
34 Screw connection
35 Current-measuring resistor
36 Weld connection
37 Copper conductor rail
38 Aluminum conductor rail
39 Aluminum conductor rail
40 Copper conductor rail
41 Weld connection
42 Copper conductor rail
43 Aluminum copper component
44 Aluminum electrolyte capacitor

The invention claimed is:

1. A composite material strip for producing an electric component, comprising:
   a) a first material strip comprising a copper-containing material for later formation of a first connecting part of the electric component,
   b) a second material strip for later formation of a second connecting part of the electric component, wherein the first material strip and the second material strip are connected together electrically and mechanically along a longitudinal seam,
   c) a third material strip comprising a resistance material for later formation of a resistance element of the component, wherein the third material strip is connected electrically and mechanically along a longitudinal seam to the first material strip, and
   d) a fourth material strip comprising the copper-containing material for later formation of a third connecting part of the component, wherein the fourth material strip is connected electrically and mechanically along its longitudinal edge to the third material strip comprising the resistance material,
   wherein the second material strip comprises an aluminum-containing material.

2. The composite material strip according to claim 1, wherein a) the first material strip comprises two material strips which are joined together along a longitudinal seam, and
b) the second material strip comprises two material strips which are joined together along a longitudinal seam.

3. The composite material strip according to claim 1, wherein
a) the first material strip is connected to the second material strip by one of the following methods:
a1) roll-plating,
a2) ultrasound welding,
and
b) the first material strip is connected to the third material strip by a weld connection, and
c) the fourth material strip is connected to the third material strip by a weld connection.

4. The composite material strip according to claim 1, wherein
a) the copper-containing material is a conductor material, and
b) the aluminum-containing material is a conductor material, and
c) the resistance material has a specific electrical resistance which is less than $50 \times 10^{-7}$ $\Omega$m and greater than $1 \times 10^{-8}$ $\Omega$m, and
d) the resistance material has a greater specific electrical resistance than the copper-containing material and the aluminum-containing material.

5. The composite material strip according to claim 4, wherein the resistance material is a copper-manganese alloy.

6. The composite material strip according to claim 4, wherein the third material strip is thinner than the other material strips.

7. The composite material strip according to claim 4, wherein the first material strip and the second material strip and the fourth material strip have the same thickness.

8. A production method for producing an electric component, comprising the following steps:
a) providing a first material strip comprising a copper-containing material for later formation of a first connecting part of the electric component,
b) providing a second material strip for later formation of a second connecting part of the electric component,
c) providing a third material strip comprising a resistance material for later formation of a resistance element of the component,
d) providing a fourth material strip comprising the copper-containing material for later formation of a third connecting part of the component,
e) joining of the first material strip to the second material strip along a longitudinal seam to form a composite material strip with an electrical and mechanical connection between the first material strip and the second material strip,
f) joining of the third material strip to the first material strip, and
g) joining of the fourth material strip to the third material strip,
wherein the second material strip comprises an aluminum-containing material.

9. The production method according to claim 8, wherein
a) the first material strip is connected to the second material strip by one of the following methods:
a1) roll-plating,
a2) ultrasound welding,
and
b) the first material strip is connected to the third material strip by a weld connection, and
c) the fourth material strip is connected to the third material strip by a weld connection.

10. The production method according to claim 8, further comprising the step of cutting of an electric component from the composite material strip transversely to the composite material strip.

11. The production method according to claim 10, further comprising the step of bending of the electric component cut from the composite material strip transversely to a longitudinal direction of the or in a current flow direction.

12. The production method according to claim 10, further comprising the step of adjustment of an electrical resistance value of the electric component cut from the composite material strip.

13. A production method for producing an electric component, comprising the following steps:
a) providing a first material strip comprising a copper-containing material for later formation of a first connecting part of the electric component,
b) providing a second material strip for later formation of a second connecting part of the electric component,
c) providing a third material strip comprising a resistance material for later formation of a resistance element of the component,
d) joining of the first material strip to the second material strip along a longitudinal seam to form a composite material strip with an electrical and mechanical connection between the first material strip and the second material strip, and
e) joining of the third material strip to the first material strip,
wherein:
i) the second material strip comprises an aluminum-containing material,
ii) the composite material strip is assembled from a tri-strip with three joined material strips and a bi-strip with two joined material strips,
iii) the tri-strip comprises two outer material strips comprising the copper-containing material and a middle material strip comprising the resistance material,
iv) the bi-strip comprises a material strip comprising the copper-containing conductor material and a material strip comprising the aluminum-containing conductor material, and
v) the material strip of the bi-strip comprising the copper-containing material is joined to the material strip one of the two outer material strips of the tri-strip comprising the copper-containing material.

14. A production method for producing an electric component, comprising the following steps:
a) providing a first material strip comprising a copper-containing material for later formation of a first connecting part of the electric component,
b) providing a second material strip for later formation of a second connecting part of the electric component,
c) providing a third material strip comprising a resistance material for later formation of a resistance element of the component,
d) joining of the first material strip to the second material strip along a longitudinal seam to form a composite material strip with an electrical and mechanical connection between the first material strip and the second material strip, and e) joining of the third material strip to the first material strip, wherein:

i) the second material strip comprises an aluminum-containing material, ii) the composite material strip is assembled from a first bi-strip and a second bi-strip, iii) the first bi-strip contains a material strip comprising the copper-containing material and a material strip comprising the aluminum-containing material, iv) the second bi-strip contains a material strip comprising the resistance material and a material strip comprising the copper-containing material, and v) the material strip of the first bi-strip comprising the copper-containing material is joined to the material strip of the bi-strip comprising the resistance material.

15. An electric component comprising:

a) a first connecting part comprising a copper-containing material, b) a second connecting part, c) a resistance element comprising a resistance material, wherein the resistance element is connected electrically and mechanically to the first connecting part, and d) a third connecting part comprising the copper-containing material, wherein the third connecting part is connected to the resistance element, so that the resistance element is arranged in a current flow path between the first connecting part and the third connecting part, wherein the second connecting part comprises an aluminum-containing material and is connected electrically and mechanically to the first connecting part.

16. The electric component according to claim 15, wherein i) the connecting parts are each plate-shaped, and ii) the resistance element is plate-shaped, and iii) the copper-containing material is copper or a copper alloy.

17. The electric component according to claim 16, wherein the aluminum-containing material is aluminum or an aluminum alloy.

18. The electric component according to claim 16, wherein the aluminum-containing material can be welded better to aluminum than the first conductor material.

19. The electric component according to claim 16, wherein the resistance material is a copper-manganese alloy.

20. The electric component according to claim 16, wherein the resistance material of the resistance element has a greater specific electrical resistance than the copper-containing material of the first connecting part and the aluminium-containing material of the second connecting part.

21. The electric component according to claim 16, wherein the resistance material of the resistance element has a specific electrical resistance which is less than $50 \times 10^{-7}$ $\Omega$m and greater than $1 \times 10^{-8}$ $\Omega$m.

22. The electric component according to claim 16, wherein the component is a resistor having a resistance value which is at least 0.1 µΩ and is at most 1000 µΩ.

23. The electric component according to claim 22, wherein the resistor has a steady current strength of at least 100 A.

24. The electric component according to claim 22, wherein the resistor has a thickness which is at least 0.2 mm and at most 20 mm.

25. The electric component according to claim 22, wherein the resistor has a resistance value with a temperature coefficient of less than 500 ppm/K.

26. The electric component according to claim 22, wherein the resistor has an inductance of less than 10 nH.

27. The electric component according to claim 22, wherein the resistor has a length in a current flow direction which is greater than 10 mm and less than 150 mm.

28. The electric component according to claim 22, wherein the resistor has a width transversely to the current flow direction which is greater than 5 mm and less than 200 mm.

29. The electric component according to claim 22, wherein the resistor has a thickness transversely to a current flow direction which is greater than 0.5 mm and less than 30 mm.

30. The electric component according to claim 16, wherein the first connecting part, the second connecting part, the third connecting part and the resistance element are cut from a composite material strip transversely to a longitudinal direction of the composite material strip, and then bent.

31. The electric component according to claim 16, wherein the resistance element is thinner than the connecting parts.

32. A conductor rail arrangement comprising:

a) a first conductor rail comprising an aluminum-containing material, and b) an electric component according to claim 15.

33. The conductor rail arrangement according to claim 32, wherein the second connecting part of the electric component is connected electrically and mechanically to the first conductor rail.

34. The conductor rail arrangement according to claim 32, wherein a) a second conductor rail comprising a copper-containing material is provided, and b) the first connecting part of the electric component contacts the second conductor rail, and c) the second connecting part of the electric component contacts the first conductor rail.

35. The conductor rail arrangement according to claim 32, wherein a) a capacitor is provided with contact tabs comprising an aluminum-containing conductor material, and b) at least one of the contact tabs of the capacitor is connected to the first conductor rail.

* * * * *